United States Patent
Miyazawa

Patent Number: 6,055,995
Date of Patent: May 2, 2000

[54] SEMICONDUCTOR MANUFACTURE APPARATUS

[75] Inventor: Ichiro Miyazawa, Tokyo, Japan

[73] Assignee: NEC Corporation, Tokyo, Japan

[21] Appl. No.: 09/053,746

[22] Filed: Apr. 2, 1998

[30] Foreign Application Priority Data

Apr. 4, 1997 [JP] Japan .................................. 9-086728

[51] Int. Cl.⁷ .................................................. B08B 3/00
[52] U.S. Cl. .............................. 134/109; 134/902; 134/3
[58] Field of Search ................................... 134/902, 109, 134/2, 3, 111; 210/651, 167, 663, 288, 321.79, 321.8, 195.2

[56] References Cited

U.S. PATENT DOCUMENTS

| | | | |
|---|---|---|---|
| 3,774,625 | 11/1973 | Wiltrout | 134/104 |
| 3,973,572 | 8/1976 | Brous | 134/57 R |
| 3,973,987 | 8/1976 | Hewitt et al. | 134/12 |
| 4,788,043 | 11/1988 | Kagiyama et al. | 422/292 |
| 4,828,660 | 5/1989 | Clark et al. | 204/82 |
| 4,917,123 | 4/1990 | McConnell et al. | 134/95 |
| 5,024,766 | 6/1991 | Mahmud | 210/668 |
| 5,032,218 | 7/1991 | Dobson | 156/642 |
| 5,327,921 | 7/1994 | Mokuo et al. | 134/182 |
| 5,352,328 | 10/1994 | Obeng et al. | 156/646 |
| 5,377,705 | 1/1995 | Smith, Jr. et al. | 134/95.3 |
| 5,378,436 | 1/1995 | Endoh et al. | 422/186 |
| 5,542,441 | 8/1996 | Mohindra et al. | 134/95.2 |
| 5,589,077 | 12/1996 | Matsuda et al. | 210/741 |
| 5,635,053 | 6/1997 | Aoki et al. | 205/746 |
| 5,686,314 | 11/1997 | Miyazaki | 436/177 |

FOREIGN PATENT DOCUMENTS

| | | |
|---|---|---|
| 3-147323 | 6/1991 | Japan . |
| 3-242536 | 10/1991 | Japan . |
| 5-139707 | 6/1993 | Japan . |
| 7-193036 | 7/1995 | Japan . |

OTHER PUBLICATIONS

"Sulfuric Acid Collection and Refinement System", Clean Technology, Dec. 1992, pp. 30–34.

*Primary Examiner*—Jill Warden
*Assistant Examiner*—Paul J. Lee
*Attorney, Agent, or Firm*—Young & Thompson

[57] ABSTRACT

A semiconductor manufacture apparatus extending chemical life and reducing chemical replenishing amounts, continuously removes excessive moisture content generated by reaction within the apparatus and can perform cleaning and stripping with stable cleaning performance and stripping performance as a result of removing moisture content in the chemicals. The semiconductor manufacture apparatus is adapted for cleaning a semiconductor substrate or stripping a photoresist applied on the surface of the semiconductor substrate by chemicals, with a moisture separating device preferentially separating moisture content from the chemicals being provided within a passage for recirculating the chemicals within the apparatus.

11 Claims, 6 Drawing Sheets

SEMICONDUCTOR MANUFACTURE APPARATUS

BACKGROUND OF THE INVENTION

1. Field of the Invention

The present invention relates to a semiconductor manufacture apparatus having a chemical regenerating function to be used in a semiconductor manufacture process.

2. Description of the Related Art

In general, in a semiconductor manufacture plant, a large amount of chemicals, such as sulfuric acid, hydrogen peroxide solution and the like are used in a semiconductor manufacture processes, such as wafer cleaning process, photoresist stripping process and so forth. Therefore, a large amount of waste liquid, such as waste acid, waste alkali and the like is generated to cause disposal problems. In recent years, for some kinds of chemicals used in large amounts, attempts have been made for collecting, refining and re-using the chemicals in the manufacture process, and thus development of regeneration methods of various waste products has been progressed.

However, when a size of a chemicals bath is increased due to increasing wafer diameter, the amount of chemicals to be used is inherently increased to increase not only the cost of the chemicals but also liquid waste disposing cost and environmental load. In this connection, it has been demanded a new technology to reduce the liquid waste amount as much as possible.

In the conventional semiconductor manufacture apparatus, when moisture content is accumulated due to decomposition of components in the chemicals, the chemicals are replenished to maintain the chemical concentration constant. For instance, sulfuric acid-hydrogen peroxide solution mixture, moisture content is accumulated in the chemicals due to deposition of hydrogen peroxide solution by heating or so forth, or by other cause, to lower concentration of sulfuric acid.

When the concentration of sulfuric acid in the solution is low, conversion amount into oxidizing substance, such as peroxomonosulfuric acid becomes small despite of the fact that large amount of hydrogen peroxide solution is contained in the chemicals thereby making it impossible to achieve satisfactory cleaning effect.

For this reason, not only hydrogen peroxide solution, but also a given amount sulfuric acid is replenished regularly to eliminate lowering the sulfuric acid concentration. However, when the concentration of sulfuric acid is lowered below a critical amount it becomes difficult to maintain cleaning performance and/or stripping performance at a given level or higher even when sulfuric acid is regularly replenished, therefore exchanging of the chemicals is performed.

Used chemicals are collected as a waste liquid and can be re-used for an application which does not require significantly high purity. A sulfuric acid refining device may be installed in a semiconductor manufacture plant for re-using sulfuric in the semiconductor manufacture process. For example, sulfuric acid regeneration device W-SARP100N-SD available from K.K. Wakomu Seisakusho can be such a sulfuric acid refining device. Japanese Unexamined Patent Publication No. Heisei 3-147323 discloses a cleaning system utilizing such a sulfuric acid refining device.

In Japanese Unexamined Patent Publication No. Heisei 3-147323, as shown in FIG. 5, a cleaning liquid to be used in the semiconductor manufacture process is first collected in a collection tank 102 through a pipeline 108. Then, impurities or moisture are subsequently removed in the sulfuric acid refining device 103 for refining high purity sulfuric acid.

In the above-identified publication, there has been disclosed a method, in which sulfuric acid is fed to a chemicals supply device 104 incorporating a chemicals tank, and when a substrate cleaning device requires an additional supply of the chemicals, high purity chemicals are supplied from the supply device to a cleaning device 101.

However, since the foregoing sulfuric acid refining device performs refining of high purity sulfuric acid by distillation, oxidizing substances, such as hydrogen peroxide, peroxomonosulfuric acid and the like in the mixture are completely decomposed during distillation. Therefore, through the foregoing process, only sulfuric acid can be regenerated. Therefore, upon re-use, hydrogen peroxide has to be newly mixed to make it difficult to reduce the required amount of hydrogen peroxide.

In Japanese Unexamined Patent Publication No. Heisei 5-139707, as shown in FIG. 6, there has been disclosed a method, in which waste sulfuric acid is supplied to a cathode chamber 123 of a two chamber type refining electrolytic bath 121 by an anion exchange membrane 122, for electrolysis, and sulfuric acid obtained from anode chamber 124 of the two chamber type refining electrolytic bath 121 is electrolyzed in the anode chamber 128 of a two bath type condensing electrolytic bath 125 separated by a cation exchange membrane 126, to perform condensation of sulfuric acid and refining of an oxidizing substance, in order to avoid lowering performance of the oxidizing substance upon regeneration.

However, the cleaning system disclosed in Japanese Unexamined Patent Publication No. Heisei 3-147323 requires replenishing of chemicals in the method similar to the prior art when moisture content is accumulated in the chemicals and thus lowers cleaning performance. As with the system of FIG. 5, oxidizing substances, such as hydrogen peroxide and the like are completely removed. Therefore, the required amount of hydrogen peroxide cannot be reduced. Therefore, as a method for removing only moisture content from the chemicals, distillation method is not effective in view of energy required. Also, the disclosed method cannot reduce number of required chemical changes and thus do not aid in improving throughput over conventional methods.

On the other hand, the method disclosed in Japanese Unexamined Patent Publication No. Heisei 5-139707, a long period of 150 to 170 hours is required for refining and condensing the chemicals of 1000 ml as shown in the embodiment. Therefore, it is not possible to perform continuous process by actually installing in the manufacture device.

SUMMARY OF THE INVENTION

It is an object of the present invention to provide a semiconductor manufacture apparatus which can extend a life of chemicals and reduce an amount of the replenishing chemicals for continuously remove excessive moisture content produced by reaction or so forth within the apparatus.

Another object of the present invention is to provide a moisture content removing method which can perform cleaning and stripping by stable cleaning performance and stripping performance by removing moisture content in the chemicals.

According to one aspect of the present invention, a semiconductor manufacture apparatus adapted for cleaning a semiconductor substrate or stripping a photoresist applied on the surface of the semiconductor substrate by chemicals, comprises:

a moisture separating device preferentially separating a moisture content from the chemicals, provided within a passage for recirculating the chemicals within the apparatus.

In the construction set forth above, the moisture separating device may comprise a gas permeable membrane and means for collecting the moisture separated from the chemicals through the gas permeable membrane by a moisture absorbent.

The moisture absorbent may be in a liquid state, and the apparatus may further comprise an absorbent regenerating device performing removal of moisture from the moisture absorbent, liquid feeding means for feeding a regenerated moisture absorbent to the moisture separating device, and a filtering means providing the regenerating function of the moisture absorbent.

In the foregoing case, the liquid feeding means and filtering means may be practically constructed with a pump and a filter, respectively.

The absorbent regenerating device may remove the moisture by a distillation method.

The moisture removing device may be detachable.

The chemicals may be a sulfuric acid-hydrogen peroxide mixture liquid.

The moisture absorbent may be concentrated sulfuric acid.

As set forth above, by continuously removing excessive moisture in the chemicals by the moisture removing device, the chemicals may not be diluted by the moisture over time. Therefore, the replenishing amount of the chemicals can be reduced. Also, as far as contamination of the chemicals which should affect the manufacture process, the chemicals may be used continuously and repeatedly. Therefore, use period of the chemicals can be expanded to reduce the amount of chemicals used. Also, since variation of composition of the chemicals can be restricted, stable cleaning performance is maintained, thus improving yield of the products and reliability thereof.

BRIEF DESCRIPTION OF THE DRAWINGS

The present invention will be understood more fully from the detailed description given herebelow and from the accompanying drawings of the preferred embodiments of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiments of the present invention with reference to the accompanying drawings. In the following description, numerous specific details are set forth in order to provide a thorough understanding of the present invention. It will be obvious, however, to those skilled in the art that the present invention may be practiced without these specific details. In other instances, well-known structures are not shown in detail in order to avoid unnecessarily obscuring the present invention.

Figure 1:
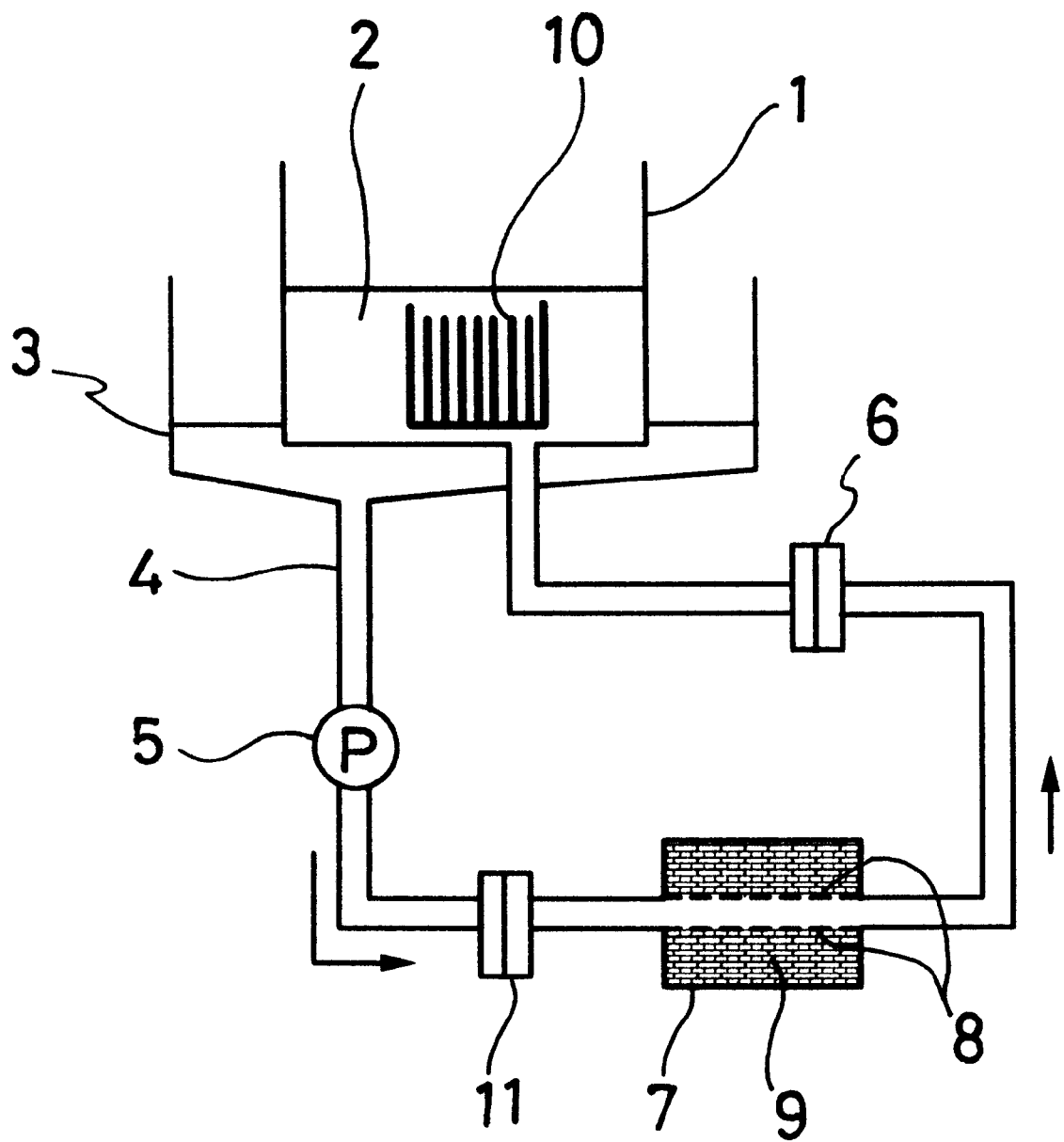
FIG. 1 is a diagrammatic illustration showing a construction of one embodiment of a semiconductor manufacture apparatus according to the present invention.
Figure 2:
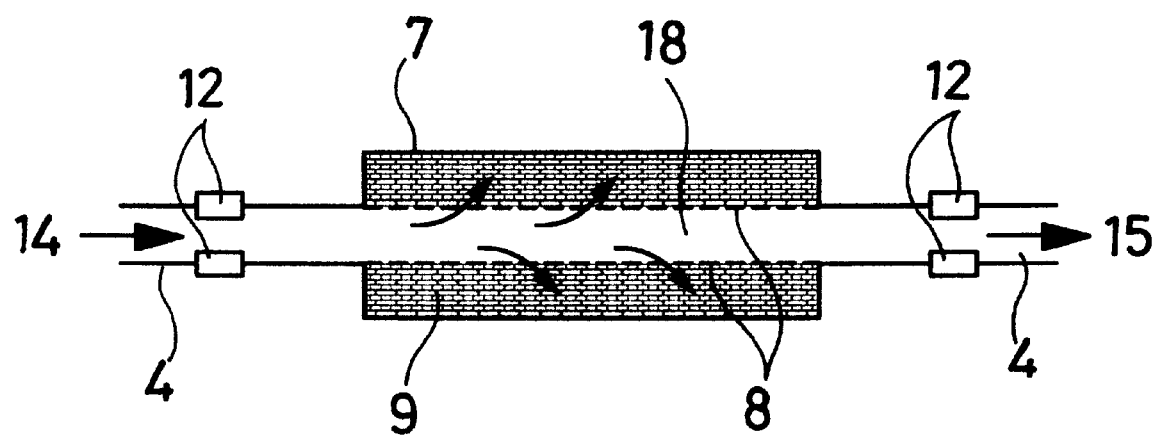
FIG. 2 is a diagrammatic illustration showing one embodiment of a moisture separating device in one embodiment of the semiconductor manufacture apparatus according to the present invention.

FIG. 1 is a diagrammatic illustration showing a construction of one embodiment of a semiconductor manufacture apparatus according to the present invention, and FIG. 2 is a diagrammatic illustration showing one embodiment of a moisture separating device in one embodiment of the semiconductor manufacture apparatus according to the present invention.

In FIG. 1, chemicals 2 are filled in a chemicals bath 1. A silicon wafer 10 is dipped within the chemicals 2 for cleaning the surface of silicon wafer 10 and stripping a photoresist applied on the silicon wafer 10, or so forth.

During treatment of the silicon wafer 10, the chemicals overflown from the chemicals bath 1 are returned to the chemical bath 1 from an overflow bath 3 through a chemicals recirculation pipe (piping) 4 having a moisture content separating device 7 and a filter 6 by a recirculation pump 5.

The chemicals contains suspended particles or the like. Such particles may deposit on a gas permeable membrane 8 to shorten the exchange period of the membrane. Therefore, it is desirable to remove the particles by means of a microfiltration membrane 11 made from fluorine contained resin or the like.

The moisture content separating device 7 is constructed with the gas permeable membrane 8 and a moisture absorbent 9. The moisture absorbent 9 is filled outside of the gas permeable membrane 8. As the gas permeable membrane 8, a tubular membrane is desirable. However, the gas permeable membrane is not necessarily tubular but can be of any appropriate shape. The moisture absorbent 9 is desirably provided with a high moisture absorbing ability. The chemicals recirculation pipe 4 and the moisture separating device 7 are joined by a joint 12 (FIG. 2) or so forth and is detachable.

The chemicals 14 (FIG. 2) containing moisture, fed from the chemicals bath 1 passes through a chemicals regenerating portion 18 of the moisture separating device 7. In the chemicals regenerating portion 18, the moisture in the chemicals passes through the gas permeable membrane 8 due to the moisture absorbing ability or the like of the moisture absorbent 9. The moisture which passes through the gas permeable membrane 8 is collected by the moisture absorbent 9. The chemicals 15, from which moisture is separated by the chemicals regenerating portion 18 is again returned to the chemicals bath 1.

Figure 3:
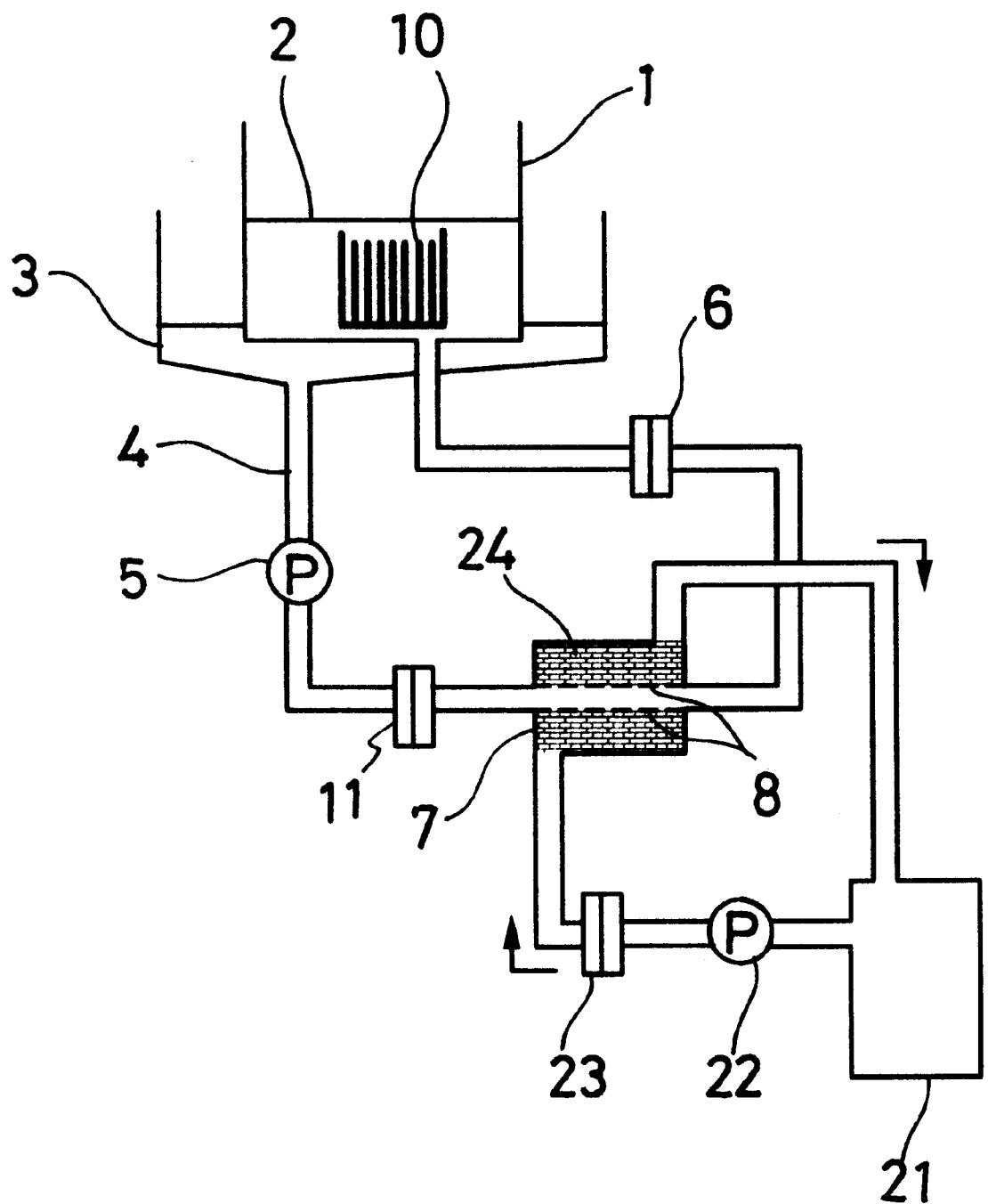
FIG. 3 is a diagrammatic illustration showing a construction of another embodiment of a semiconductor manufacture apparatus according to the present invention.

Next, another embodiment of the semiconductor manufacture apparatus according to the present invention will be discussed with reference to FIG. 3. It should be noted that like components to those shown in FIG. 1 will be identified by like reference numerals to avoid repetitive detailed description thereof in order to keep the disclosure simple and to facilitate clear understanding of the present invention.

As a moisture absorbent collecting the moisture content in the chemicals, a liquid state moisture absorbent is used. The moisture separated from the chemicals 2 and passed through the gas permeable membrane 8, is absorbed by the liquid state moisture absorbent 24. The moisture is fed from the moisture separating device 7 by pump 22 to a liquid state absorbent storage tank 21 to be temporarily stored therein, and is again fed to the moisture separating device via filter 23. By repeating this operation, the moisture in the chemicals can be continuously separated and removed.

Figure 4:
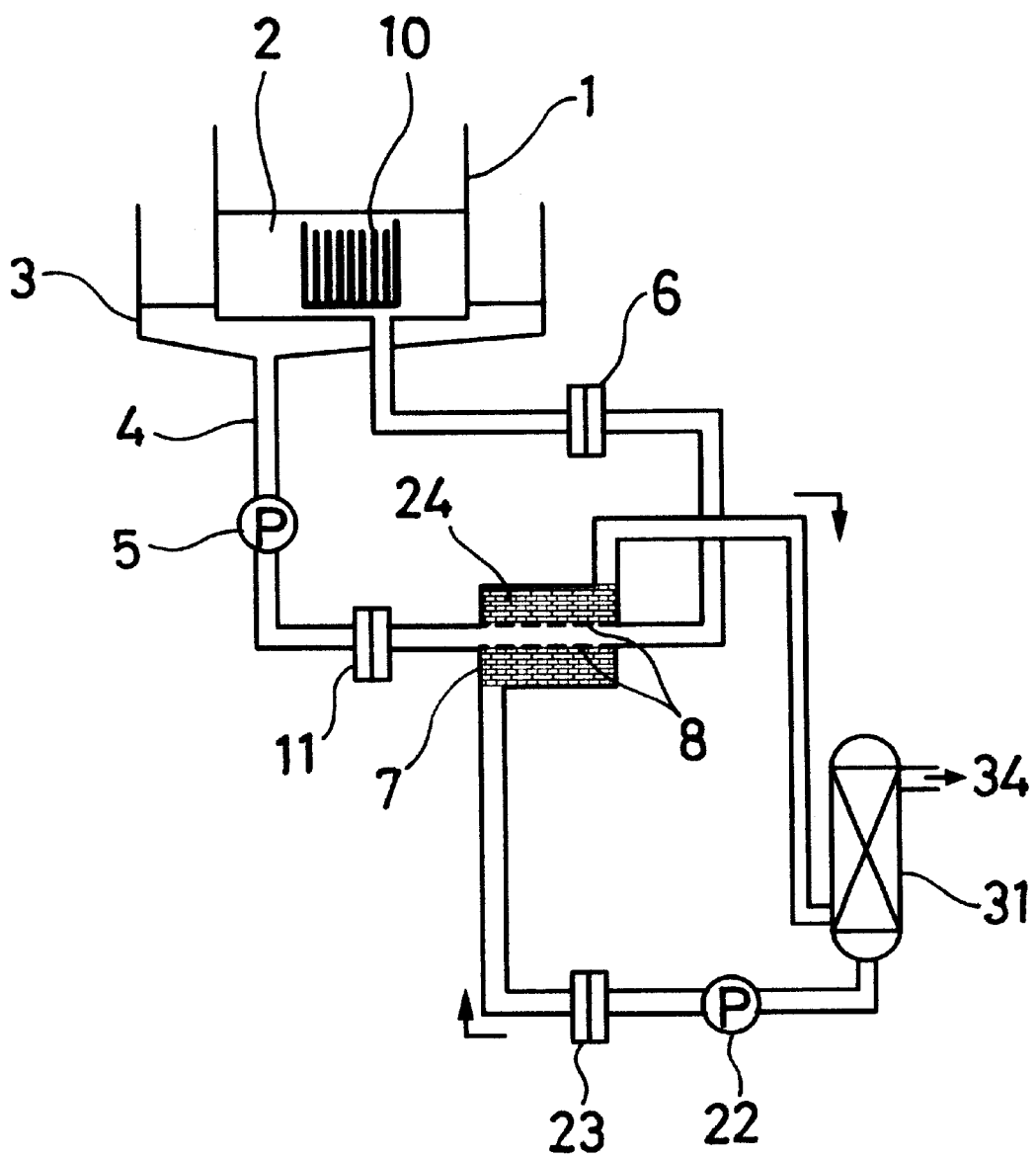
FIG. 4 is a diagrammatic illustration showing a construction of a further embodiment of a semiconductor manufacture apparatus according to the present invention.
Figure 5:
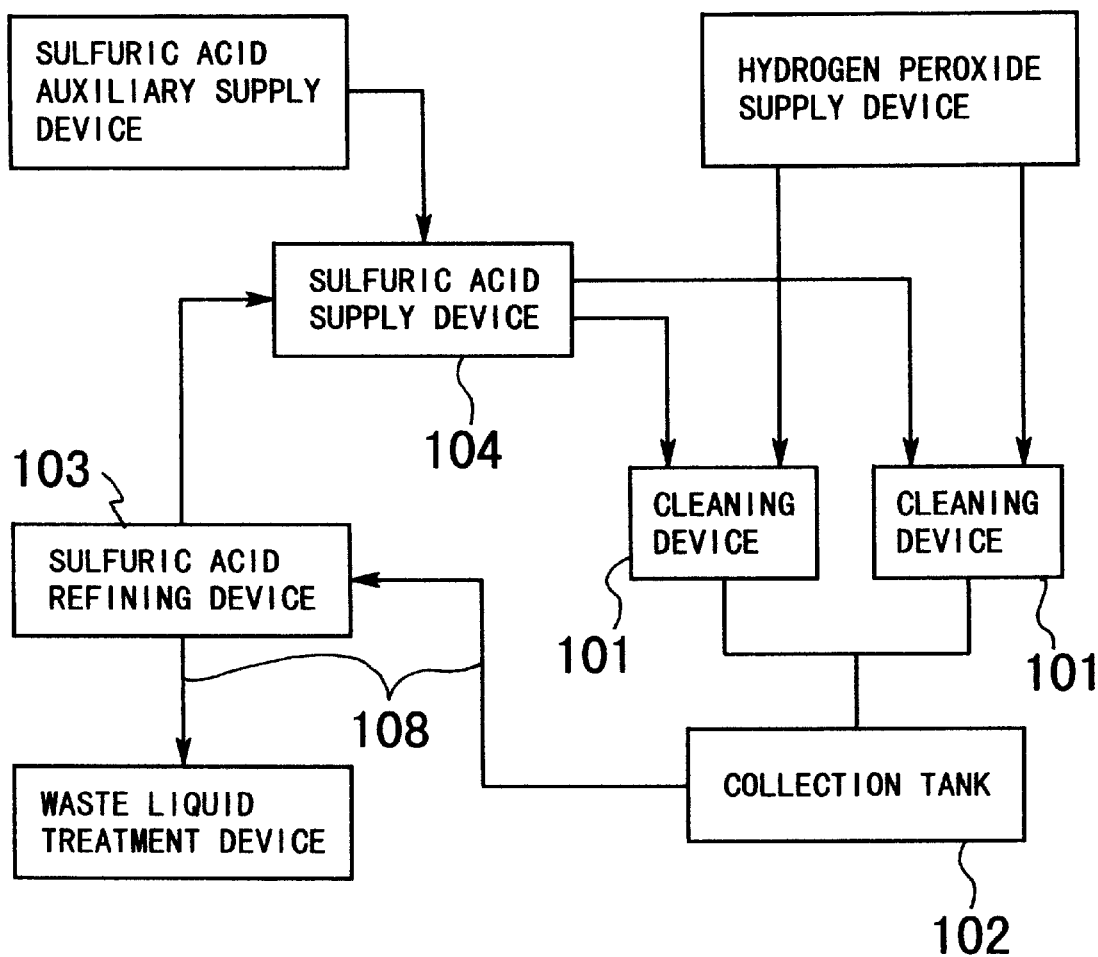
FIG. 5 is a diagrammatic explanatory illustration showing a construction of one example of the conventional chemicals regeneration method.
Figure 6:
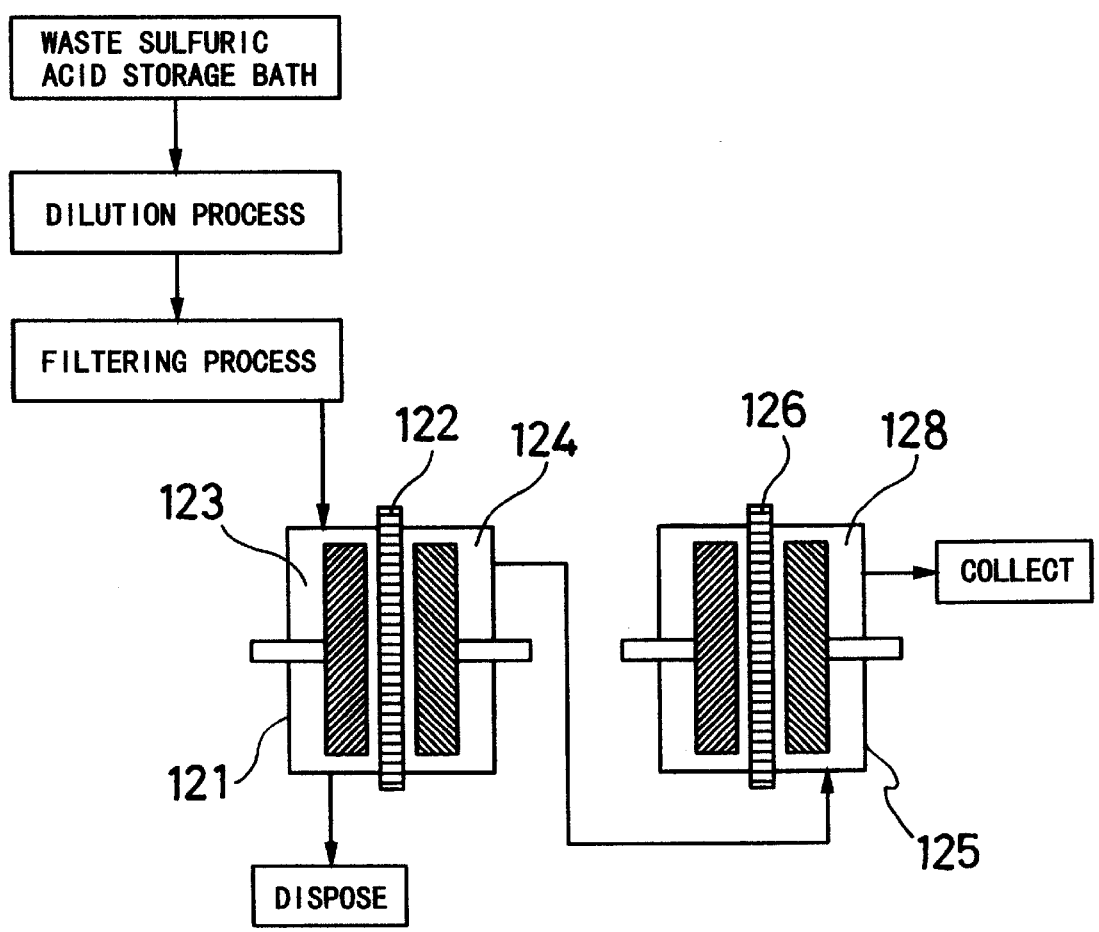
FIG. 6 is a diagrammatic explanatory illustration showing a construction of one example of the conventional chemicals regeneration method.

Next, the third embodiment of the semiconductor manufacture apparatus will be discussed in detailed with reference to the diagrammatic illustration of FIG. 4. It should be noted that like components in FIG. 4 to those shown in FIG. 3 will be identified by like reference numerals in order to simplify the disclosure, avoid redundant discussion, and to facilitate clear understanding of the present invention.

The liquid state moisture absorbent 24 containing moisture is fed to a distillation column 31 from a moisture separating device 7 by a liquid feeding means 22. In the distillation column 31, the liquid state moisture absorbent 24 is heated for removing moisture 34. By reducing pressure within the distillation column 31, removal of moisture can be promoted. The moisture 34 is removed as a gas and discharged from the upper portion of the distillation column 31. The liquid state absorbent remaining as residual is fed to the moisture separating device 7 from the bottom of the distillation column 31 by the liquid feeding means 22.

While an example, in which the distillation column is used in regeneration of the liquid state moisture absorbent, has been discussed, the separating method is not specified to the distillation method. Also, it is possible to provide a cooling device at the intermediate portion of the piping in order to cool the liquid state moisture absorbent after distillation. By repeating the foregoing operation, the moisture in the chemicals can be continuously separated, and since the absorbent can be repeatedly used, the amount of the waste liquid can be minimized.

Particular examples of the present invention will be discussed hereinafter in detail with reference to the drawings, however, the following examples are not exhaustive and specific to the present invention.

EXAMPLE 1

A particular example 1 will be discussed in detail in terms of the apparatus shown in FIG. 1, in greater detail. It should be noted that unless otherwise indicated, indication of % represents % by weight.

As an initial condition, the silicon wafer was cleaned by a sulfuric acid-hydrogen peroxide mixture liquid initially containing 5% of hydrogen peroxide, 80% of sulfuric acid and 15% of moisture. The chemicals bath has a capacity of 40 litters, 98% concentrated sulfuric acid as the moisture absorbent of 50 liters is used. A contact area of the gas permeable membrane with the chemicals is assumed to be 1000 $cm^2$.

When cleaning of the silicon wafer is performed, the composition of the chemicals 2 in the chemicals bath 1 is varied to contain 3% of hydrogen peroxide, 78% of sulfuric acid and 19% of moisture. By recirculating the chemicals 2 by the recirculation pump 5 as the liquid recirculating means, removal of particles in the chemicals 2 is performed by means of the microfiltration membrane 11. After removal of particles, the moisture is separated by feeding into the moisture separating device 7.

At this time, the moisture contained in the chemicals passes through the gas permeable membrane 8 to be connected with the moisture absorbent 9. The chemicals in the vicinity of the exit of the moisture separating device 7 becomes 3.2% of hydrogen peroxide, 82.1% of sulfuric acid and 14.7% of moisture. While the amount of the hydrogen peroxide and amount of sulfuric acid in the chemicals are not varied, sulfuric acid and hydrogen peroxide are concentrated to increased concentrations by selectively passing the moisture content through the gas permeable membrane 8.

When separation of moisture content is performed for a long period and the moisture absorbing ability of the moisture absorbent approaches saturation thereby lowering moisture content separation performance, the moisture separating device 7 is disconnected from the chemicals recirculating pipe 4 at the joint 12 to be exchanged with new moisture separating device. The moisture absorbent 9 reaching saturation of the moisture absorbing amount is subject to a regeneration process to be used by filling in the moisture separating device 7 after regeneration. By repeating the foregoing operation, the moisture in the chemicals can be continuously separated and removed.

EXAMPLE 2

Next, the example 2 will be discussed in detail in terms of the embodiment shown in FIG. 3. The initial condition is the same as the case of the foregoing example 1 discussed in terms of the embodiment of FIG. 1. When cleaning of the silicon wafer was performed, the composition of the chemicals is varied to contain 3% of hydrogen peroxide, 78% of sulfuric acid and 19% of moisture.

The chemicals 2 are recirculated by the liquid recirculating means 5. Then, particles are removed from the chemicals 2 by the microfiltration membrane 11. After removal of the particles, the chemicals 2 are fed to the moisture separating device 7 to contact with 98% concentrated sulfuric acid as the liquid state moisture absorbent 24 via the gas permeable membrane 8. The moisture contained in the chemicals 2 passes through the gas permeable membrane. By diffusion of the moisture in the concentrated sulfuric acid, the concentration of concentrated sulfuric acid as the liquid state moisture absorbent 24 is lowered to 95%.

Then the composition of the chemicals in the vicinity of the outlet of the moisture separating device 7 becomes 3.2% of hydrogen peroxide, 82.1% of sulfuric acid and 14.7% of moisture. While amount of the hydrogen peroxide and amount of sulfuric acid are not varied between the inlet and outlet of the moisture separating device 7, the chemicals are concentrated by selectively passing the moisture through the gas permeable membrane 8.

The liquid state moisture absorbent 24 (95% concentrated sulfuric acid) absorbing the moisture is fed to the liquid state moisture absorbent storage tank 21 from the moisture separating device 7 by the liquid feeding means 22 to be stored once. Thereafter, the liquid state moisture absorbent 24 is again fed into the moisture separating device 7. When the moisture is separated for a long period, the concentrated sulfuric acid as the liquid state moisture absorbent 24 absorbs the moisture in the chemicals to lower moisture absorbing ability.

When the moisture absorbing ability of concentrated sulfuric acid is lowered, concentrated sulfuric acid is exchanged to newly fill concentrated sulfuric acid having high moisture separating ability. Used concentrated sulfuric acid is regenerated by distillation or so forth for re-using. By repeating this operation, the moisture in the chemicals can be continuously removed.

EXAMPLE 3

Next, the example 3 will be discussed in detail in terms of the embodiment shown in FIG. 4. The initial condition is the same as the case of the foregoing example 1 discussed in terms of the embodiment of FIG. 1. When cleaning of the silicon wafer was performed, the composition of the chemicals is varied to contain 3% of hydrogen peroxide, 78% of sulfuric acid and 19% of moisture. The chemicals 2 are recirculated by the liquid recirculating means 5, and then, particles are removed from the chemicals 2 by the microfiltration membrane 11.

After removal of the particles, the chemicals 2 are fed to the moisture separating device 7 to contact with 98% concentrated sulfuric acid as the liquid state moisture absorbent 24 via the gas permeable membrane 8. The moisture content in the chemicals 2 passes through the gas permeable membrane. By diffusion of the moisture in the concentrated sulfuric acid, the concentration of concentrated sulfuric acid as the liquid state moisture absorbent 24 is lowered to 95%. Then the composition of the chemicals in the vicinity of the outlet of the moisture separating device 7 becomes 3.2% of hydrogen peroxide, 82.1% of sulfuric acid and 14.7% of moisture.

While amount of the hydrogen peroxide and amount of sulfuric acid are varied little between the inlet and outlet of the moisture separating device 7, the chemicals are concentrated by selectively passing the moisture through the gas permeable membrane 8 to increase concentrations. The liquid state moisture absorbent 24 (95% concentrated sulfuric acid) absorbing the moisture is fed to the distillation column 31 from a moisture separating device 7 by a liquid feeding means 22. In the distillation column 31, the liquid state moisture absorbent 24 is heated for removing moisture 34 as a vapor. By reducing pressure within the distillation column 31, removable of moisture can be promoted. The concentrated sulfuric acid as the moisture absorbent residual is condensed to be again fed to the moisture separating device 7 as 98% concentrated sulfuric acid.

By removing the moisture contained in the chemicals according to the foregoing procedure, the moisture content in the chemicals can be maintained constant. As a result, lowering of chemical concentrations can be minimized, and cleaning characteristics of the chemicals can be maintained constant. On the other hand, the moisture absorbing characteristics of the chemicals can be continuously regenerated by distillation or so forth and can be used repeatedly, the use amount of the moisture absorbent can also be reduced.

Concerning a replenishing amount of the chemicals, a given amount of chemicals is regularly replenished at a regular time interval in the conventional method. However, despite this, the components of the chemicals are diluted to lower concentration despite of regular replenishment of the chemical for exchanging the chemicals when the concentration below a lower than or equal to a lower limit value. However, according to the present invention, since moisture in chemicals is removed to make lowering of concentration moderate, an interval of exchanging of the chemicals is increased. Accordingly, frequency of exchanging of chemicals can be lowered to reduce not only replenishing amount but also exchanged amount of the chemicals.

As set forth above, according to the present invention, it becomes possible to continuously remove moisture in the chemicals to expand the life of the chemicals and to reduce the replenishment amount for reducing the cost for the chemicals, and for reducing environmental load.

In addition, since it becomes possible to maintain the moisture content in the chemicals constant, to restrict lowering of concentration of the chemicals, to maintain the cleaning characteristics of the chemical constant, to improve yield in manufacture of the products and reliability of the products.

Furthermore, the moisture absorbent absorbed the moisture separated from the chemicals can be regenerated continuously by distillation or so forth for repeated use to reduce use amount of the moisture absorbent.

In the foregoing disclosure, the method for continuously removing moisture from the chemicals used in manufacture process of the semiconductor to demonstrate remarkable effect. However, the present invention is applicable not only for semiconductor manufacture process but also applicable for variety of fields.

Although the present invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A semiconductor manufacture apparatus adapted for cleaning a semiconductor substrate and stripping a photoresist applied on the surface of said semiconductor substrate by a sulfuric acid and hydrogen peroxide chemical mixture in a first bath, comprising:

a moisture separating device preferentially separating a moisture content from said sulfuric acid and hydrogen peroxide chemical mixture, provided within a passage for recirculating said chemical mixture within the apparatus to the first bath.

2. A semiconductor manufacture apparatus adapted for cleaning a semiconductor substrate or stripping a photoresist applied on the surface of said semiconductor substrate by a sulfuric acid and hydrogen peroxide chemical mixture in a first bath, comprising:

a moisture separating device preferentially separating a moisture content from said sulfuric acid and hydrogen peroxide chemical mixture, provided within a passage for recirculating said chemical mixture within the apparatus to the first bath, wherein said moisture separating device comprises a moisture absorbent and a gas permeable membrane and means for collecting the moisture separated from said sulfuric acid and hydrogen peroxide chemical mixture through said gas permeable membrane by said moisture absorbent.

3. A semiconductor manufacture apparatus as set forth in claim 2, wherein said moisture absorbent absorbing moisture from said sulfuric acid and hydrogen peroxide chemical mixture is in a liquid state, and said apparatus further comprises an absorbent regenerating device performing removal of moisture from said moisture absorbent, liquid feeding means for feeding a regenerated moisture absorbent to said moisture separating device, and a filtering means providing a regenerating function of said moisture absorbent.

4. A semiconductor manufacture apparatus as set forth in claim 3, wherein said liquid feeding means and filtering means are a pump and a filter, respectively.

5. A semiconductor manufacture apparatus as set forth in claim 3, wherein said absorbent regenerating device removes the moisture by a distillation method.

6. A semiconductor manufacture apparatus as set forth in claim 5, wherein said moisture absorbent is concentrated sulfuric acid.

7. A semiconductor manufacture apparatus as set forth in claim 2, wherein said moisture removing device co-acting with said sulfuric acid and hydrogen peroxide chemical mixture is detachable.

8. A semiconductor manufacture apparatus as set forth in claim 2, wherein said moisture absorbent is concentrated sulfuric acid.

9. A semiconductor chemical regenerating system for regenerating a chemical mixture of sulfuric acid and hydrogen peroxide comprising:

a first bath tank designed and adapted for treating a semiconductor substrate;

a moisture absorbent comprising sulfuric acid;

a receiving means for receiving a moisture contaminated sulfuric acid and hydrogen peroxide chemical mixture from said first bath tank;

a moisture separating device receiving the chemical mixture through an untreated inlet port and discharging a regenerated chemical mixture through a treated discharge port, said moisture separating device comprising a gas permeable membrane separating a first region containing the chemical mixture and a second region containing said moisture absorbent; and a return means connected to said treated discharge port operatively connected to said first bath tank to return said regenerated chemical mixture to said first bath tank.

10. The system of claim 9, wherein said sulfuric acid moisture absorbent is in a liquid state.

11. The system of claim 10, wherein said sulfuric acid is 98% by weight concentrated.

\* \* \* \* \*